(12) United States Patent
Maslov et al.

(10) Patent No.: US 7,261,352 B2
(45) Date of Patent: Aug. 28, 2007

(54) ELECTROSTATICALLY DRIVEN CARBON NANOTUBE GRIPPING DEVICE

(75) Inventors: Leonid Maslov, Suwon-si (KR); Jin-gyoo Yoo, Seongnam-si (KR); Cheol-soon Kim, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 140 days.

(21) Appl. No.: 11/142,374

(22) Filed: Jun. 2, 2005

(65) Prior Publication Data
US 2006/0076790 A1 Apr. 13, 2006

Related U.S. Application Data

(60) Provisional application No. 60/587,083, filed on Jul. 13, 2004.

(30) Foreign Application Priority Data
Aug. 5, 2004 (KR) ............... 10-2004-0061794

(51) Int. Cl.
*B25J 7/00* (2006.01)
(52) U.S. Cl. .................. 294/99.1; 294/86.4; 977/849; 977/962
(58) Field of Classification Search ........... 294/99.1, 294/86.4, 1.1; 977/724, 849, 855, 858, 962; 901/31, 36
See application file for complete search history.

(56) References Cited

U.S. PATENT DOCUMENTS

| 6,669,256 B2 | 12/2003 | Nakayama et al. |
| 2005/0029827 A1* | 2/2005 | Hashiguchi et al. ....... 294/86.4 |

FOREIGN PATENT DOCUMENTS

JP 2003-225895 A 8/2003

OTHER PUBLICATIONS

Nanotube Nanotweezers; Philip Kim and Charles M. Lieber; Dec. 10, 1999; vol. 286 Science; www.sciencemag.org.

* cited by examiner

*Primary Examiner*—Dean J. Kramer
(74) *Attorney, Agent, or Firm*—Sughrue Mion, PLLC

(57) ABSTRACT

An apparatus is provided for gripping nano-scale objects, wherein the apparatus includes a probe including a base portion and a terminal portion. First and second nanotubes are secured to the base portion of the probe, wherein each of the first and second nanotubes include a protruding portion which extends past the base portion and the terminal portion of the probe. First and second electrodes are formed on the base portion of the probe and electrically connected to the first and second nanotubes. A third electrode is disposed on the terminal portion of the probe. A control circuit applies a voltage to the first, second and third electrodes to close the protruding portions of the first and second nanotubes by charging the first and second nanotubes to a first polarity and charging the third electrode to a second polarity opposite to the first polarity.

19 Claims, 12 Drawing Sheets

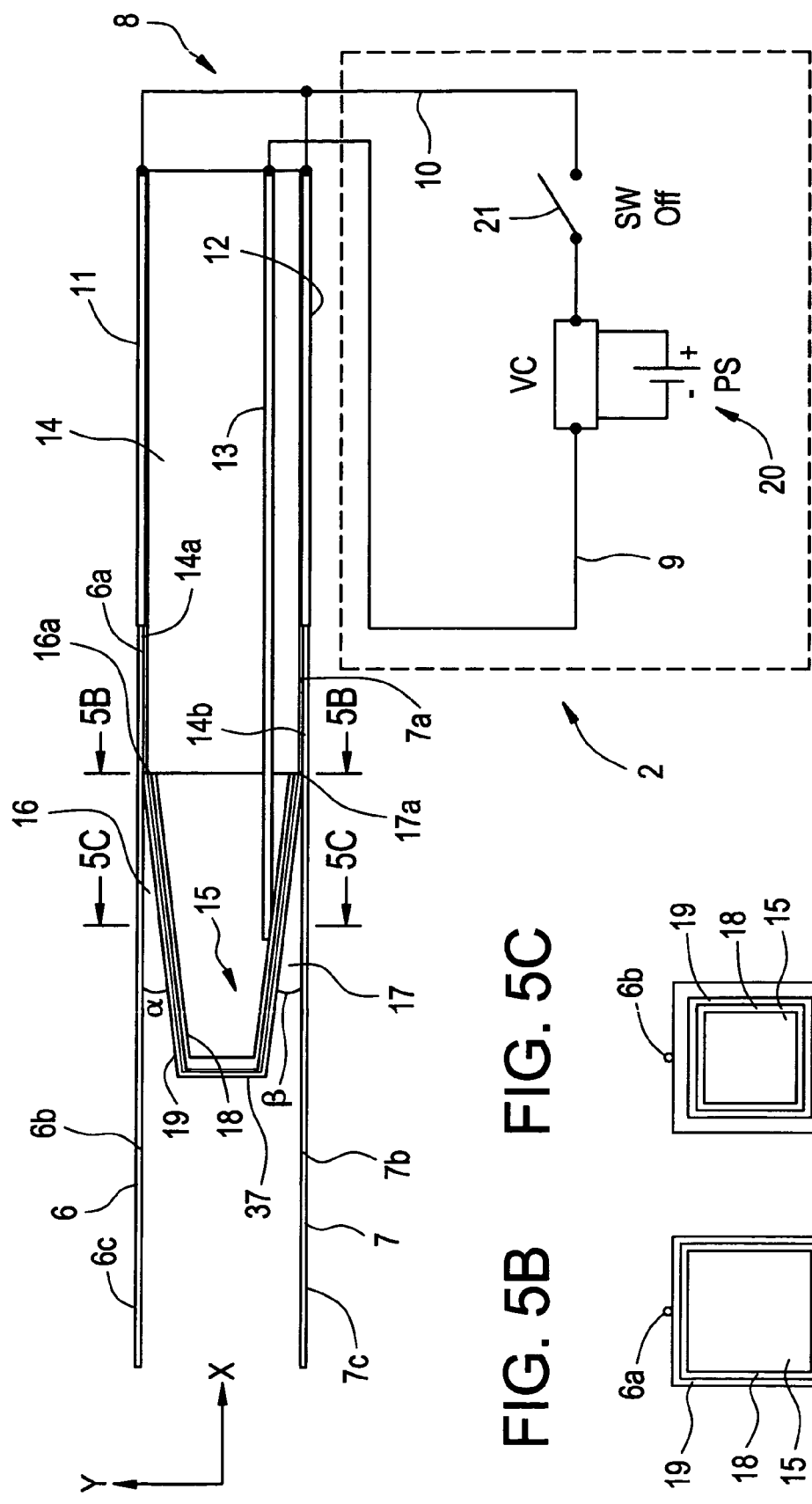

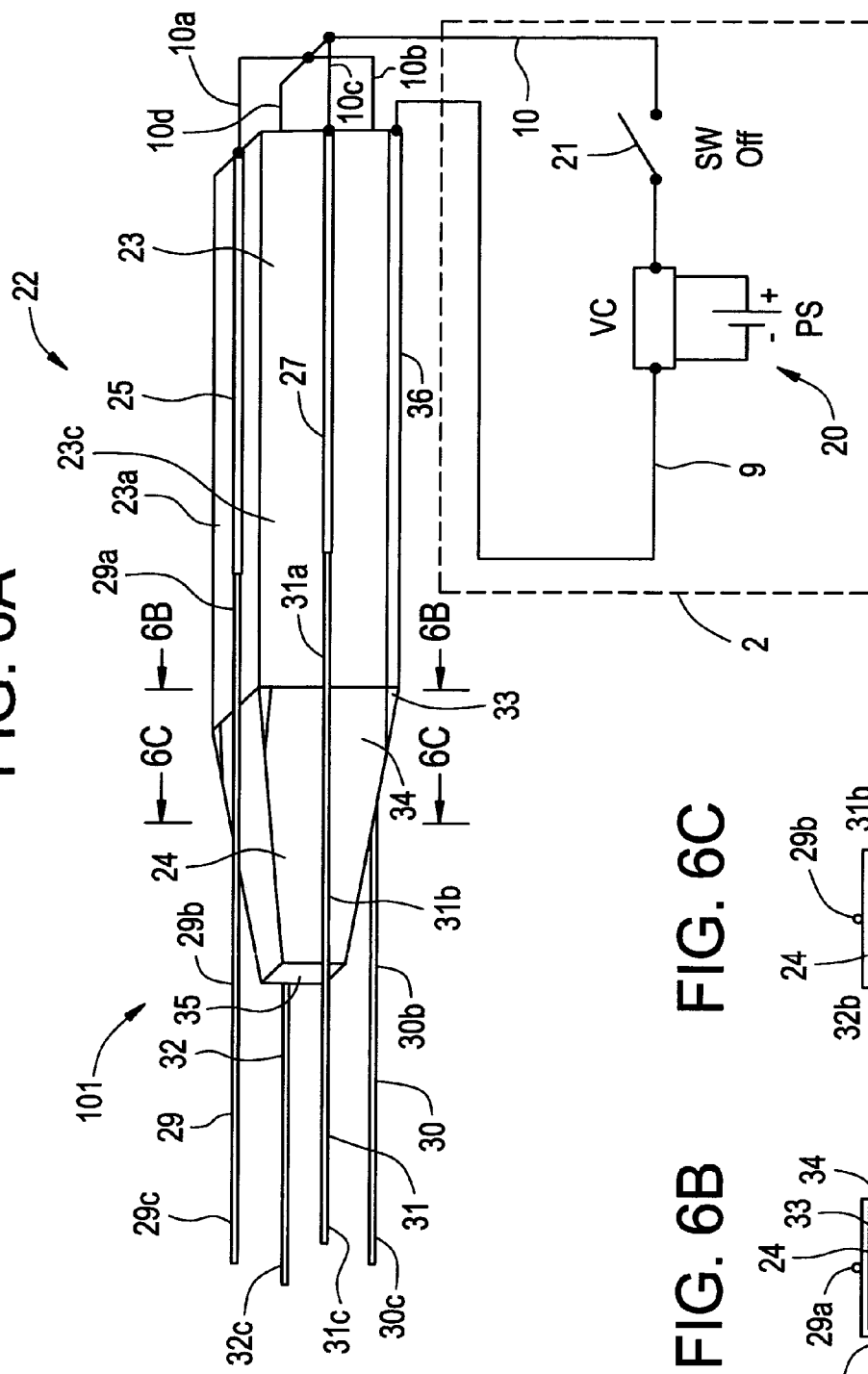
FIG. 6A
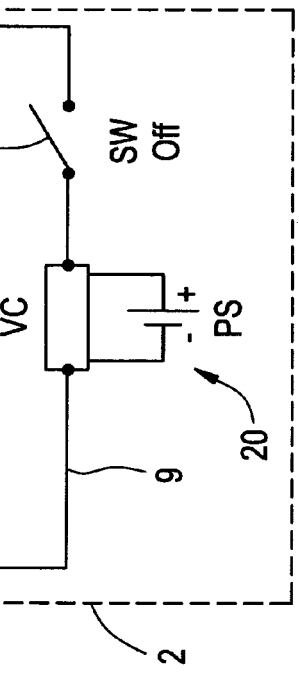
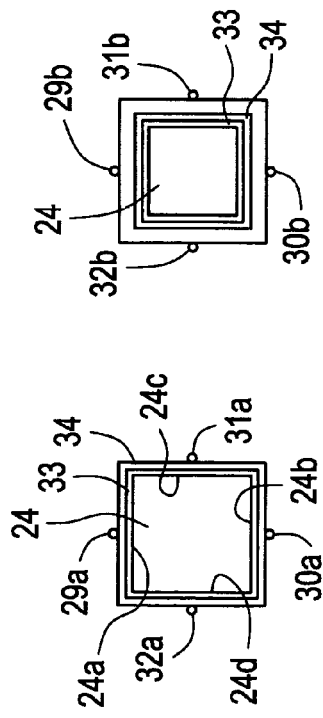
FIG. 6B
FIG. 6C

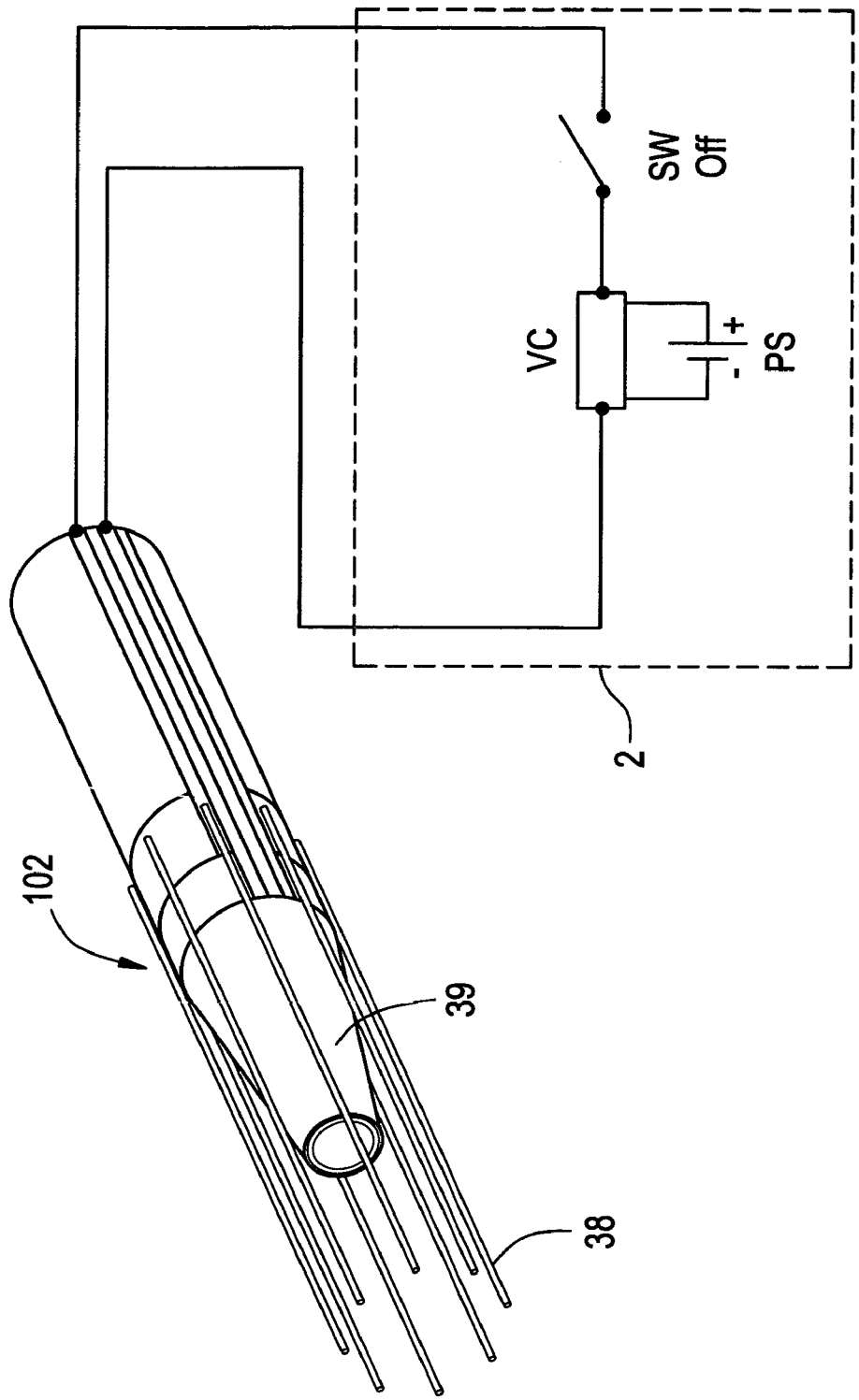

ELECTROSTATICALLY DRIVEN CARBON NANOTUBE GRIPPING DEVICE

CROSS-REFERENCE TO RELATED APPLICATIONS

This application claims priority from U.S. Provisional Patent Application No. 60/587,083 filed Jul. 13, 2004 in the United States Patent and Trademark Office, and Korean Patent Application No. 2004-0061794 filed Aug. 5, 2004 in the Korean Intellectual Property Office, the disclosures of which are incorporated herein by reference in their entirety.

BACKGROUND OF THE INVENTION

1. Field of the Invention

The present invention relates to an apparatus for gripping nano-size objects, and more particularly to a gripping apparatus which utilizes electrostatically-driven carbon nanotubes for gripping nano-size objects.

2. Description of the Prior Art

The development of new tools for manipulating and probing matter at a nanometer length scale is critical to advances in nanomechanics, nanoscale physics, and nanotechnology. Atomic force microscopes, scanning probe microscopes and scanning tunneling microscopes are currently used for these purposes because these microscopes are capable of working at length scales as small as a single atom. However, conventional atomic force microscopes, scanning probe microscopes and scanning tunneling microscopes are provided with a single probe tip which limits the ability to manipulate nano-objects. That is, the single probe tip cannot grab an object and, therefore, cannot provide for secure and accurate movement of the nano-object to a desired destination or position.

Nanotweezers have been developed to grip and manipulate nano-objects in view of the limitations of the above-mentioned microscopes having the single probe tip. The nanotweezers can grip and release objects, thereby facilitating new kinds of operations and assembly of nano-scale particles and structures.

For example, as shown in FIG. 1, a pair of nanotweezers 88, developed Phillip Kim and Charles M. Lieber ("Nanotube Nanotweezers", Journal of Science, volume 286, pp. 2148-2150, Dec. 10, 1999), includes metal electrode films 84a and 84b which are respectively formed on circumferential surfaces of a tapered glass tube 80 with an insulating section 82 interposed therebetween. Carbon nanotubes 86a and 86b are respectively fastened to the metal electrode films 84a and 84b so that the carbon nanotubes 86a and 86b protrude to form the nanotweezers 88.

As shown in FIG. 2, when a voltage is applied from a direct-current power supply 94 to the nanotweezers 88 via lead wires 92a and 92b connected to contact points 90a and 90b on the metal electrode films 84a and 84b, the carbon nanotube 86a is charged to a positive polarity, while the carbon nanotube 86b is charged to a negative polarity. As a result of the electrostatic attractive force of these positive and negative charges, the tip ends of the carbon nanotubes 86a and 86b close inward, so that a nano-substance 96 can be gripped between the tip ends. If the voltage is reduced to zero, the electrostatic attractive force is eliminated, so that the carbon nanotubes 86a and 86b are caused to return to the state shown in FIG. 1 by the elastic recovery force of the carbon nanotubes 86a and 86b and the nano-substance 96 is thereby released. Thus, opening-and-closing control of the nanotweezers 88 can be accomplished by controlling the magnitude of the voltage, e.g., 0 to 10 V, applied to the metal electrode films 84a and 84b.

However, the nanotweezers 88 have several drawbacks. More specifically, a first drawback is that since the tip ends of the glass tubes 80 are finely worked to 100 nm in a tapered form, the nanotweezers 88 are relatively weak and brittle.

A second drawback results from the metal electrode films 84a and 84b being formed along the entire length of the glass tube 80, and the contact points 90a and 90b being disposed on the large-diameter rear portion of the glass tube and connected to the power supply 94 via the lead wires 92a and 92b. In particular, since the lead wires 92a and 92b have a considerable thickness, the electrical contact points 90a and 90b must be disposed on the rear end portion of the glass tube which has an expanded diameter. This results in the difficulty of forming the metal electrode films along the entire length of the glass tube and in poor efficiency.

A third drawback arises from the fact that the nanotweezers are operated by electrostatic action between the carbon nanotubes 86a and 86b. That is, positive and negative electrical charges are accumulated in the carbon nanotubes 86a and 86b, and the opening and closing of the carbon nanotubes 86a and 86b is controlled by the electrostatic attractive force of these electrical charges. In the case where the nano-substance 96 is an electrical insulator or a semiconductor, such an electrostatic attractive force can be effectively utilized. However, in the case where the nano-substance 96 is a conductor, the ends of the carbon nanotubes 86a and 86b are electrically short-circuited, so that the electrostatic attractive force ceases to operate. Furthermore, there is also a danger that the nano-substance 96 will be electrically destroyed in the case of short-circuiting. Accordingly, the use of the nanotweezers 88 is limited to semiconductor nano-substances and insulating nano-substances, and constant care must be taken during use.

A fourth drawback is that since the nanotweezers 88 are constructed from only two carbon nanotubes, there are various shaped nano-substances that cannot be securely gripped. For example, although flattened nano-substances can be stably gripped by the two carbon nanotubes 86a and 86b, the gripping hold on a spherical nano-substance or rod-like nano-substance may be unstable such that there is a risk that the nano-substance will fall out of the nanotweezers.

With reference to FIG. 3, U.S. Pat. No. 6,669,256 to Nakayama et al. discloses nanotweezers 50 including three nanotubes 54 whose base end portions are fastened to a holder 51 such that the nanotubes protrude from the holder 51. The nanotubes 54 are coated with a coating film which insulates and covers the surfaces of the nanotubes 54. Lead wires 52 are connected to the nanotubes 54 via electrode films 53. The tip ends of the nanotubes 54 are freely opened and closed by means of an electrostatic attractive force generated by applying a voltage across the lead wires 52 such that two of the nanotubes 54 are negatively charged while the third nanotube 54 is positively charged.

The coating film on the nanotubes 54 is made of an insulative material in order to prevent short-circuiting between the nanotubes 54 and a nanosubstance to be gripped. For example, the coating film may be a hydrocarbon film formed on the surfaces of the conductive nanotubes by electron beam irradiation. However, the method for forming the coating film is quite complicated in case of nano-scale objects such as carbon nanotubes. Further, the thickness of the carbon nanotube shell is equal to one carbon atomic layer. Hence, the layer of any new material can be expected to sufficiently change the electrical and mechanical properties of the carbon nanotubes.

Even though the nanotubes are covered with the insulative coating layer, the risk of short-circuiting still exists in the case where a higher voltage is applied, accidentally or intentionally to generate a stronger attractive force, or in the case of a defect (cracking, thinning, breakage, etc.) of the coating film, e.g., due to material fatigue. The likelihood of a defect occurring in the coating film is increased as the coating film covering the nanotubes is repeatedly exposed to large deformations, and hence, very strong stresses originate in the material causing cracks and film destruction.

Further, despite the insulative coating film, an electromagnetic field exists between charged nanotubes which can adversely effect some types of objects in an harmful and unpredictable manner, especially biological living substances such as cells, genes, DNA, etc.

Lastly, while the use three or more nanotube arms provides for more secure gripping of a nanosubstance, this results in complex interaction among the positively and negatively charged nanotubes.

SUMMARY OF THE INVENTION

Illustrative, non-limiting embodiments of the present invention overcome the above disadvantages and other disadvantages not described above. Also, the present invention is not required to overcome the disadvantages described above, and an illustrative, non-limiting embodiment of the present invention may not overcome any of the problems described above.

According to an aspect of the present invention, an apparatus is provided for gripping nano-scale objects, wherein the device comprises: a probe including a base portion and a terminal portion; first and second nanotubes secured to the base portion of the probe, each of the first and second nanotubes including a protruding portion which extends past the base portion and terminal portion of the probe; first and second electrodes formed on the base portion of the probe, the first and second electrodes being electrically connected to the first and second nanotubes, respectively; a third electrode disposed on the terminal portion of the probe; and a control circuit which is electrically connected to the first, second and third electrode and applies a voltage to the first, second and third electrodes so that the first and second nanotubes are charged to a first polarity and the third electrode is charged to a second polarity opposite to the first polarity thereby causing the protruding portions of the first and second nanotubes to close due to an electrostatic force generated between the first and second nanotubes and the third electrode.

BRIEF DESCRIPTION OF THE DRAWINGS

The above and other aspects of the present invention will be more apparent by describing in detail illustrative, non-limiting embodiments thereof with reference to the accompanying drawings, in which:

FIG. 5A illustrates a gripping apparatus according to a first exemplary embodiment of the present invention;

FIG. 5B illustrates a sectional view of the gripping apparatus of FIG. 5A taken along the line 5B-5B;

FIG. 5C illustrates a sectional view of the gripping apparatus of FIG. 5A taken along the line 5C-5C;

FIG. 6A illustrates a gripping apparatus according to a second exemplary embodiment of the present invention;

FIG. 6B illustrates a sectional view of the gripping apparatus of FIG. 6A taken along the line 6B-6B;

FIG. 6C illustrates a sectional view of the gripping apparatus of FIG. 6A taken along the line 6C-6C;

FIGS. 7A and 7B are exemplary diagrams illustrating a perspective view and a front view, respectively, of the electrostatic nanotweezers according to a third exemplary embodiment of the present invention;

DETAILED DESCRIPTION OF EXEMPLARY EMBODIMENTS OF THE INVENTION

Figure 1:
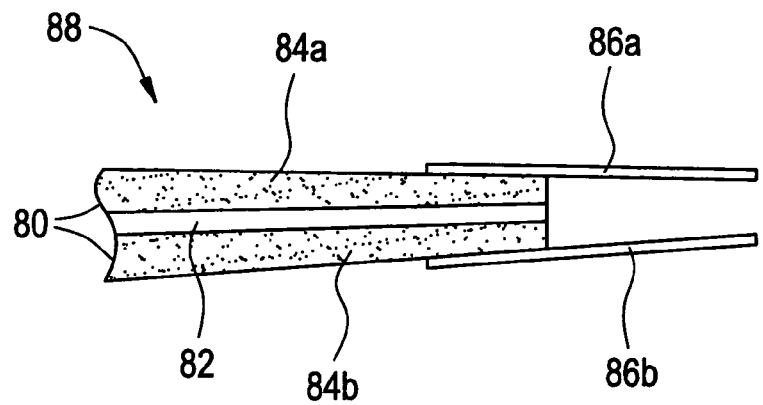
FIG. 1 is an explanatory diagram illustrating a conventional nanotweezer apparatus.
Figure 2:
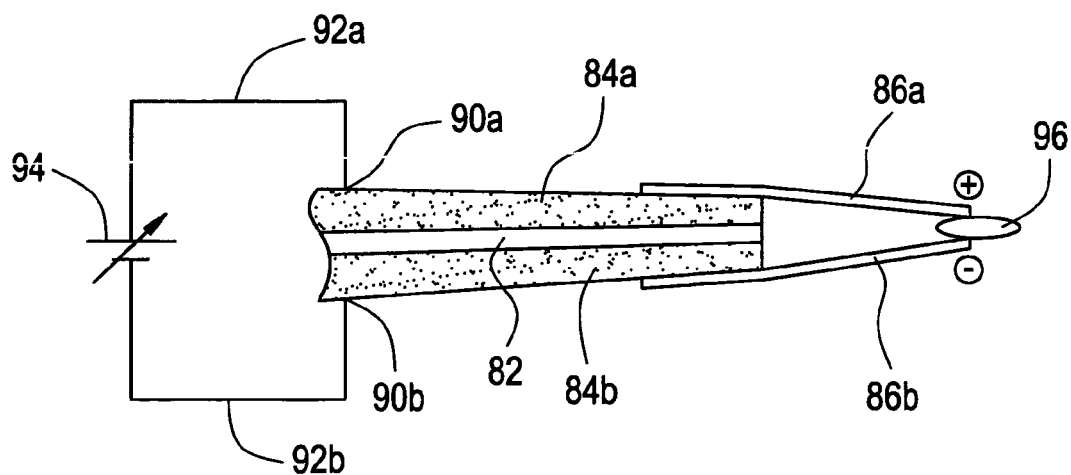
FIG. 2 is an explanatory diagram illustrating operation of the conventional nanotweezer apparatus of FIG. 1.
Figure 3:
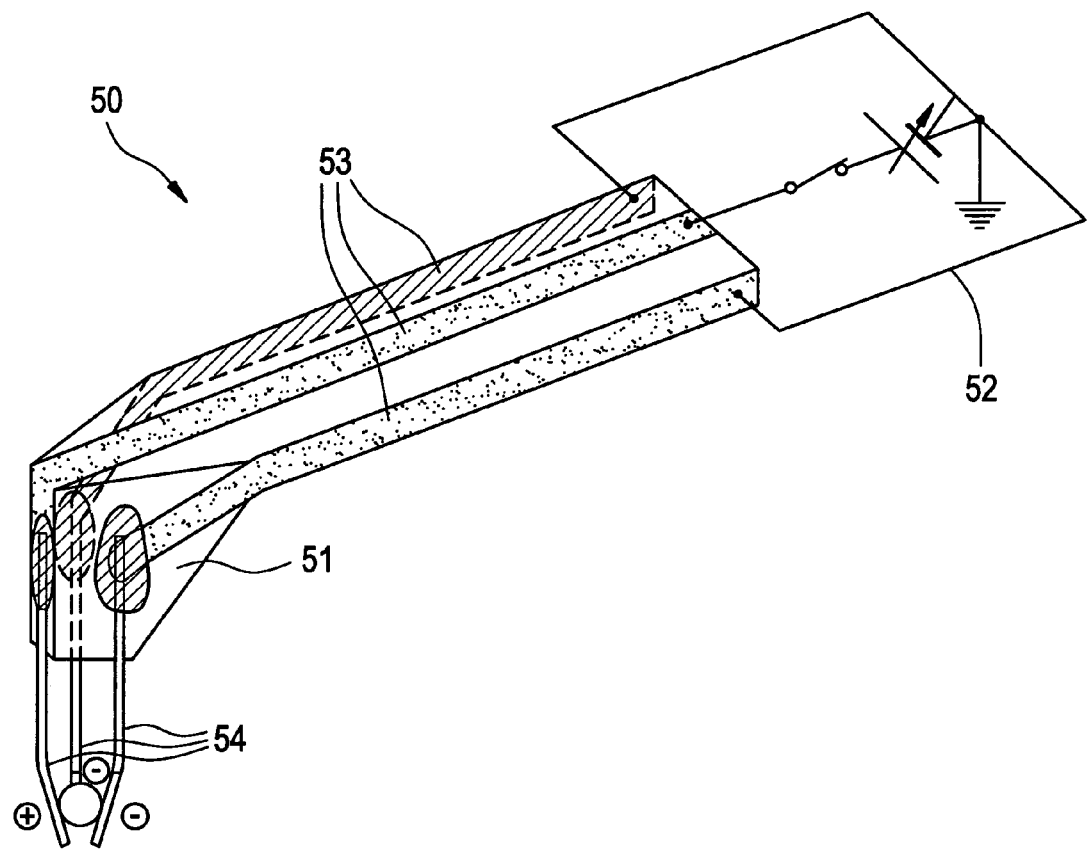
FIG. 3 is an explanatory diagram illustrating another conventional nanotweezer apparatus.

Hereinafter, exemplary embodiments of the present invention will be described in detail with reference to the accompanying drawings.

Aspects of the present invention, and methods for achieving them will be apparent to those skilled in the art from the detailed description of the exemplary embodiments together with the accompanying drawings. However, the scope of the present invention is not limited to the exemplary embodiments disclosed in the specification, and the present invention can be realized in various types. The described exemplary embodiments are presented only for completely disclosing the present invention and helping those skilled in the art to completely understand the scope of the present invention, and the present invention is defined only by the scope of the claims. Additionally, the same reference numerals are used to designate the same elements throughout the specification and drawings.

Figure 4:
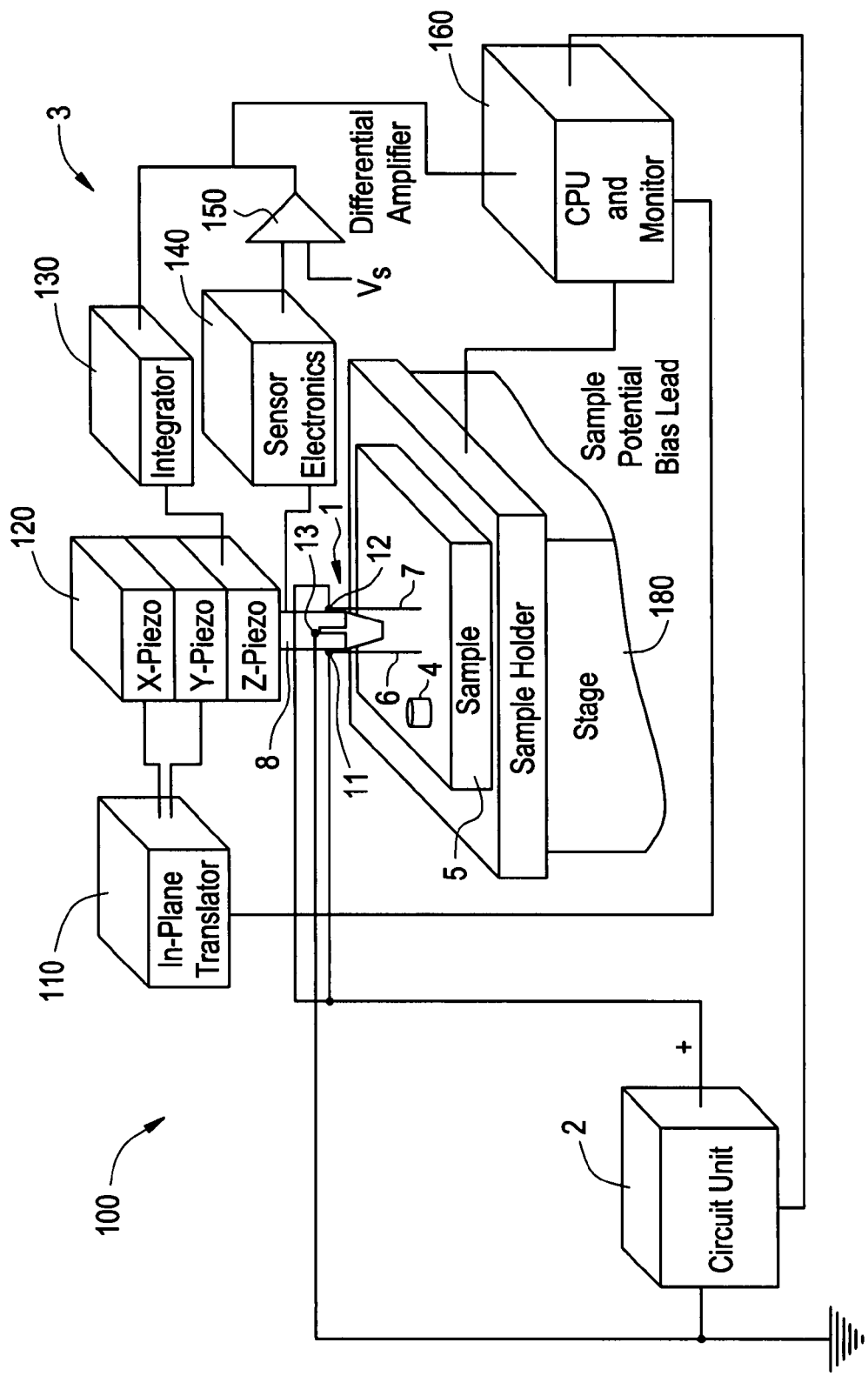
FIG. 4 is a diagram of a nanomanipulator system utilizing a scanning tunneling microscope unit according to an exemplary embodiment of the present invention.

FIG. 4 is an explanatory diagram of a nanomanipulator system 100 according to an exemplary embodiment of the present invention. The nanomanipulator system 100 comprises a scanning tunneling microscope (STM) unit 3, an electrostatically driven carbon nanotube gripping apparatus 1 secured to a probe 8 of the STM unit 3, and a control circuit unit 2 for controlling operation of the nanotube gripping apparatus 1. An atomic force microscope (AFM) unit can be used in place of the STM unit 3 since both microscope units utilize a fine sharpened silicon tip, which is presumed to have a single atom at the apex and is accurately scanned above the surface of a sample. As in a conventional apparatus, the STM unit 3 includes a translation unit 110, piezo-electric elements 120, an integrator 130, a sensor unit 140, a differential amplifier 150 and a CPU 160. The STM unit 3 detects a nano-scale object 4 disposed on the surface of the sample 5, and positions and orients the sample 5 with the object 4.

In operation, the STM unit 3 is raster-scanned across the sample 5 in a non-contact manner so that a bias potential is applied between the tip of the probe 8 and the sample 5 and a tunneling current is measured across the gap between the tip of the probe 8 and the sample 5. Operation of an AFM unit is similar to that of the STM unit, except that the probe tip contacts the sample surface and interatomic Van der Waals forces acting between the tip and the sample provide a contrast mechanism, rather than a tunneling current.

FIG. 5A illustrates a configuration of the gripping apparatus 1 of FIG. 4 according to a first exemplary embodiment of the present invention. As shown in FIG. 5A, the gripping apparatus 1 includes at least two carbon nanotubes 6 and 7 that are disposed on a parallelepiped base portion 14 of the probe 8. In particular, base end portions 6a and 7a of the nanotubes 6 and 7 are secured to opposing middle side surfaces 14a and 14b of the probe 8 and electrically connected to electrode films 11 and 12 formed on the side surfaces of the probe 8.

The material of the microscope probe 8 may be pure dielectric, such as glass, or silicon. In the case of a glass microscope probe, a layer of Cr—Au is evaporated on the opposing middle side surfaces 14a and 14b of the glass structure to form the electrode films 11 and 12, and the carbon nanotubes 6 and 7 are attached to the electrode films 11 and 12 using an approach similar to that used for the fabrication of conventional single-nanotube scanning probe microscope tips. In the case of a silicon microscope probe, it is possible to attach the base end portions 6a and 7a of the nanotubes 6 and 7 to the probe 8 by fusing the base end portions 6a and 7a to the middle side surfaces 14a and 14b of the probe 8 using electron beam irradiation or electrical heating. Further, the base end portions 6a and 7a of the nanotubes 6 and 7 can be electrically connected to the electrode films 11 and 12 in the same manner.

A terminal portion 15 of the probe 8 protrudes from the parallelepiped base portion 14. The nanotubes 6 and 7 include protruding portions 6b and 7b which extend past the base portion 14 of the probe 8 and along a length of the terminal portion 15 of the probe 8, and tip end portions 6c and 7c which extend past the terminal portion 15 of the probe 8. The terminal portion 15 has a pyramidal shape which allows the protruding portions 6b and 7b of the carbon nanotubes 6 and 7 to be elastically deformed in the X-Y plane in free space areas 16 and 17 defined by plane angles $\alpha$ and $\beta$ between protruding portions 6b and 7b of the nanotubes 6 and 7 and the terminal portion 15. In the exemplary embodiment, although the angles $\alpha$ and $\beta$ are assumed to be substantially equal to each other, the angles $\alpha$ and $\beta$ may be different without departing from the spirit and scope of the invention. Further, although the shape of terminal portion 15 in the exemplary embodiment is pyramidal, the shapes of the terminal portion 15 is not limited thereto and may take other forms such as a tapered polygonal shape or a conical shape, wherein a cross-sectional area of the terminal portion gradually decreases towards a distal end or tip of the terminal portion.

The terminal portion 15 is fully or partially covered by an electrode film 18 which is connected with an electrode film 13 formed on a side surface of the probe 8. The electrode film 18 is separated from the base portions 6a and 7a of the nanotubes 6 and 7 by the free space areas 16 and 17. In order to prevent a possible short circuit between the electrode film 18 and protruding portions 6b and 7b of the nanotubes 6 and 7 during deformation, the surface of the electrode film 18 is coated by an insulating film 19. The terminal portion 15 is covered by the electrode film 18 and the insulating film 19 to form a protruding probe tip 37 of the microscope probe 8. FIGS. 5B and 5C are cross-sectional views illustrating the terminal portion 15, the electrode film 18 and the insulating film 19.

The electrode films 11, 12, 13 and 18 and the insulating film 19 may be formed using conventional methods. For example, a coating film may be formed by decomposing an organic gas by means of electron beam irradiation inside an electron microscope. In the case where the organic gas is, for example, a hydrocarbon gas, the coating film is a hydrocarbon film, which is suitably utilized as an insulating film. In the case where the organic gas is a metallic-organic gas, the coating films are metal films which are utilized as electrode films and provide secure electrical continuity between the conductive nanotubes 6 and 7 and the lead wires 10.

The control circuit 2 comprises a DC power supply 20 including a voltage control circuit VC, wherein a negative output of the power supply 20 is connected to the electrode film 13 via the lead wire 9 and a positive output of the power supply 20 is connected to the electrode films 11 and 12 via a switch 21 and the lead wire 10. However, the negative output of the power supply 20 may be connected to the electrode film 13 and the positive output of the power supply 20 may be connected to the electrode films 11 and 12 so long as the nanotubes 6 and 7 are charged to a same polarity which is opposite to that of the electrode film 18.

As will be described in detail, the carbon nanotube gripping apparatus 1 provides a firm and reliable gripping of the nano-scale objects 4 intended for further manipulation on the sample 5. In particular, the control circuit unit 2 provides gripping motion control of the carbon nanotubes 6 and 7 of the gripping apparatus 1 by selectively applying an appropriate voltage to the nanotubes 6 and 7 and the electrode film 18 covering terminal portion 15 of the probe 8.

FIG. 6A is a schematic perspective view of a gripping apparatus 101 according to a second exemplary embodiment of the present invention. A probe 22 includes a base portion 23 and a terminal portion 24 having a pyramidal shape and four side surfaces 24a, 24b, 24c, and 24d.

Four electrode films (two of the electrode films 25 and 27 are shown in FIG. 6A) are formed on side surfaces of the base portion 23. Four conductive nanotubes 29, 30, 31, and 32 are respectively secured at their corresponding base end portions 29a, 30a, 31a, and 32a to the side surfaces of the base portion 23 of the probe 22, for example, by electron beam irradiation, electrical heating, or any other conventional method. Accordingly, the carbon nanotubes 29, 30, 31, and 32 are electrically connected to the electrode films which are connected to a positive output of the power supply 20 of the control circuit 2 via the lead wire 10. In operation, the conductive nanotubes 29, 30, 31, and 32 become positively charged when the electrical switch 21 is closed.

As shown in FIGS. 6B and 6C, the side surfaces 24a, 24b, 24c, and 24d of the terminal portion 24 of the probe 22 are firstly coated by an electrode film 33, and secondly coated by an insulating film 34, e.g., a dielectric substance, which prevents the occurrence of a short circuit between the conductive nanotubes 29, 30, 31, and 32 and the electrode film 33 when a voltage is applied. This layered structure forms a protruding tip 35 of the probe 22.

The lead wire 9 connects the negative pole of the power supply 20 with an electrode film 36 which is disposed along an edge of a base parallelepiped portion 23 of the probe 22 and connected with the electrode film 33. Accordingly, if the electrical switch 21 is closed, the protruding tip 35, or more precisely the electrode film 33, functions as a negative pole.

Protruding portions 29b, 30b, 31b, and 32b of the conductive nanotubes 29, 30, 31, and 32 extend past the protruding tip 35, so that tip end portions 29c, 30c, 31c, and 32c of the conductive nanotubes 29, 30, 31, and 32 can grip and release nano-scale particles to be handled.

Figure 7B:
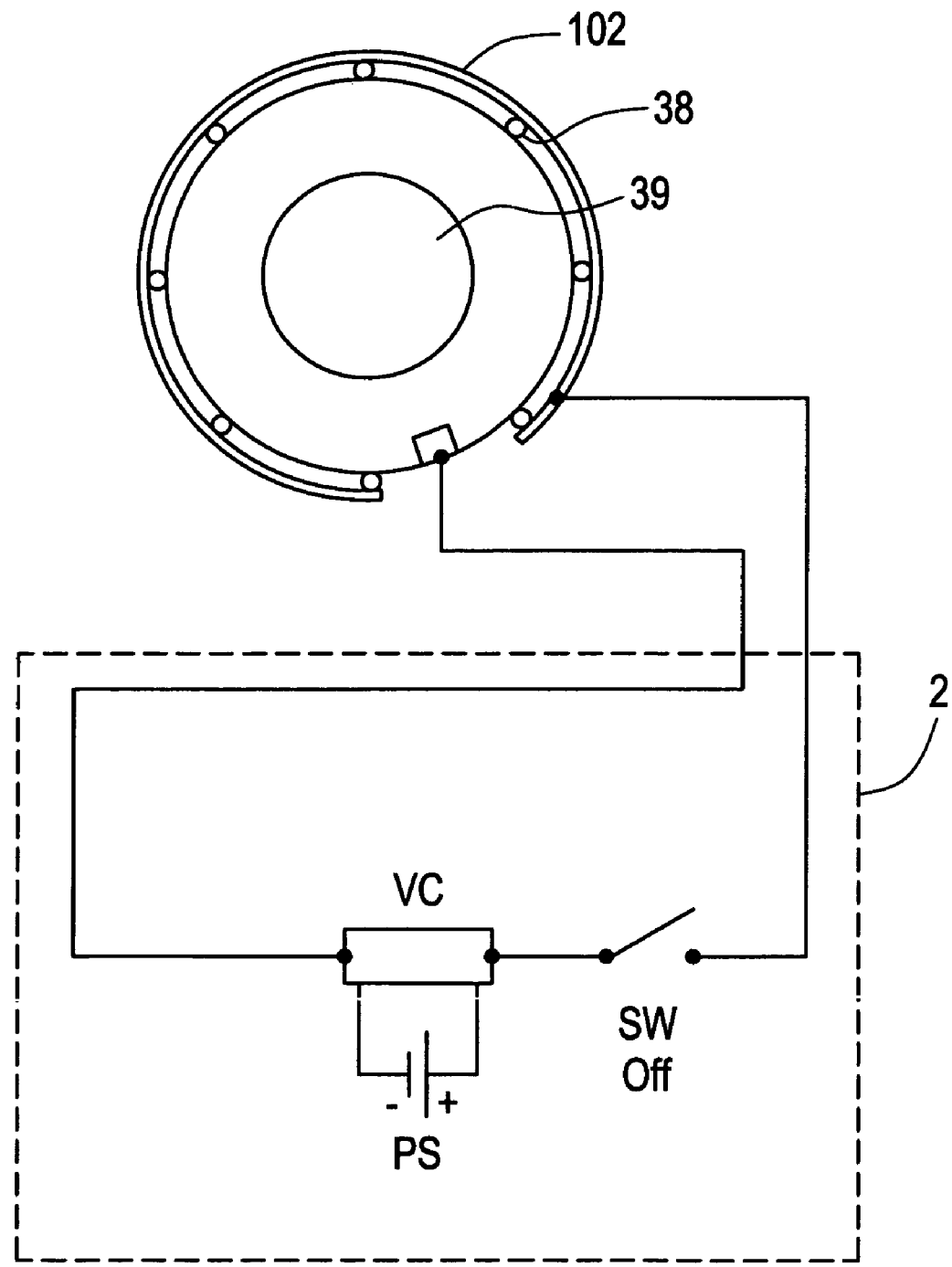

FIGS. 7A and 7B illustrate a schematic perspective view and a front view, respectively, of a gripping apparatus 102 according to a third exemplary embodiment of the present invention. A protruding probe tip 39 of the gripping apparatus 102 has a conical shape and includes a plurality of the carbon nanotubes 38 (eight nanotubes are shown in the exemplary embodiment) arranged a substantially equal intervals around the protruding tip 39.

Similar to the second exemplary embodiment, the gripping apparatus 102 of the third embodiment utilizes at least three nanotubes to provide more stable and secure gripping of nano-substances of arbitrary shapes, especially those having a spherical shape.

Figure 8A:
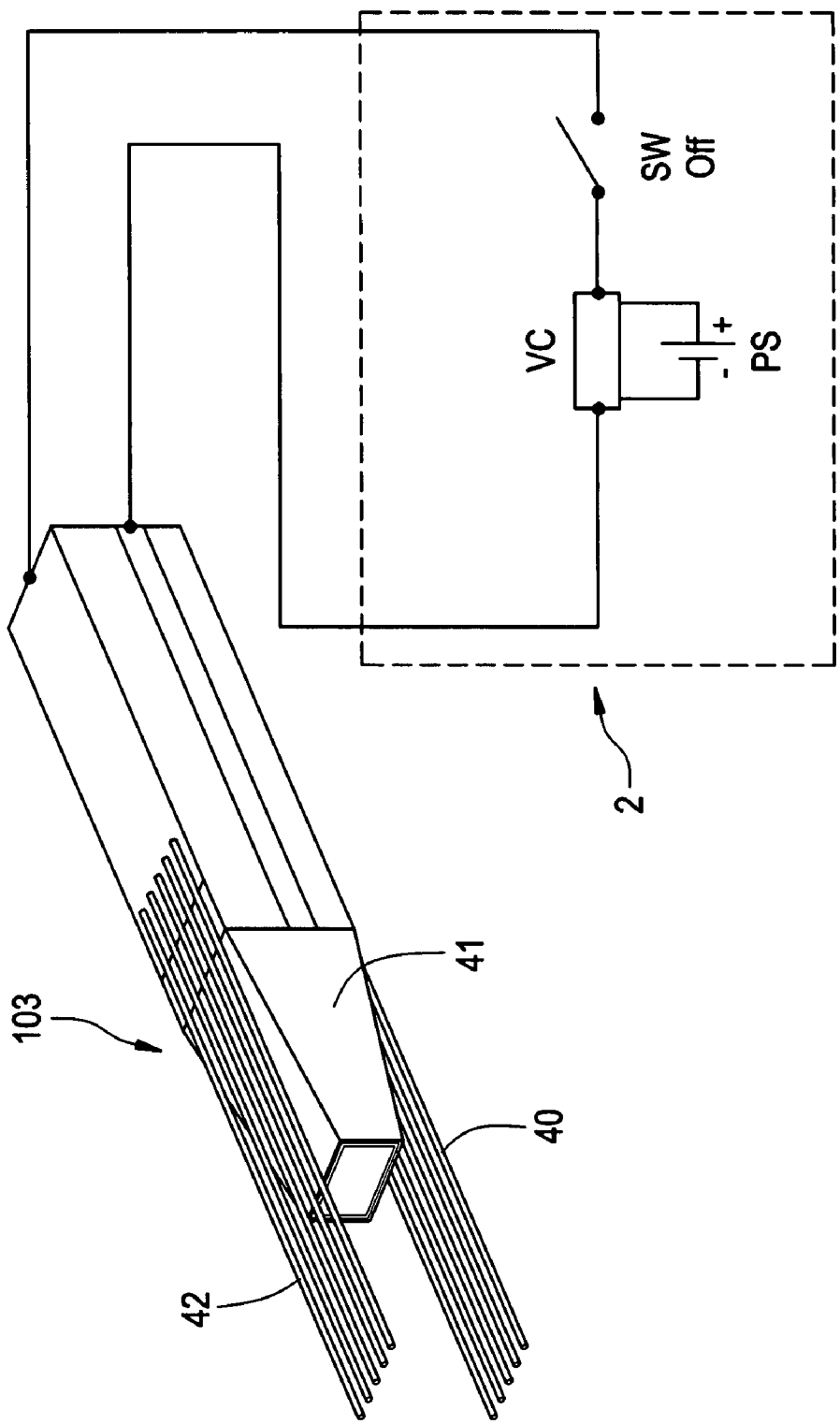
FIGS. 8A and 8B are exemplary diagrams illustrating a perspective view and a front view, respectively, of the electrostatic nanotweezers according to a fourth exemplary embodiment of the present invention.
Figure 8B:
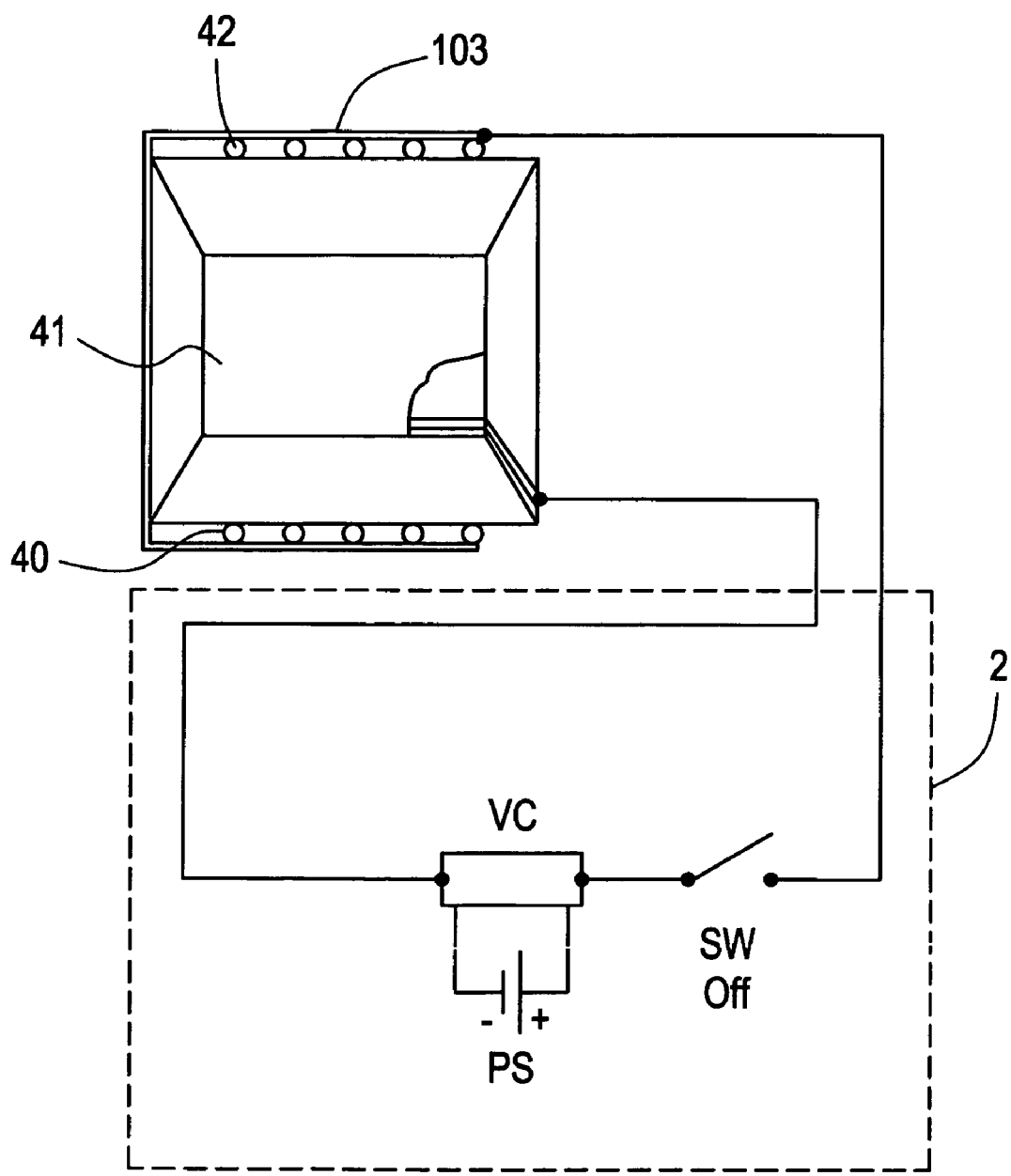

FIGS. 8A and 8B illustrate a schematic perspective view and a front view, respectively, of a gripping apparatus 103 according to a fourth exemplary embodiment of the present invention. A protruding probe tip 41 has a pyramidal shape, wherein a plurality of carbon nanotubes 40 are assembled on a first side of the gripping apparatus 103 and a plurality of carbon nanotubes 42 are assembled on a second side of the gripping apparatus 103 which is opposite to the first side.

As compared to the previous exemplary embodiments, the design of the gripping mechanism 103 may provide a more secure gripping mechanism for nano-structures having an elongated shape.

Figure 9:
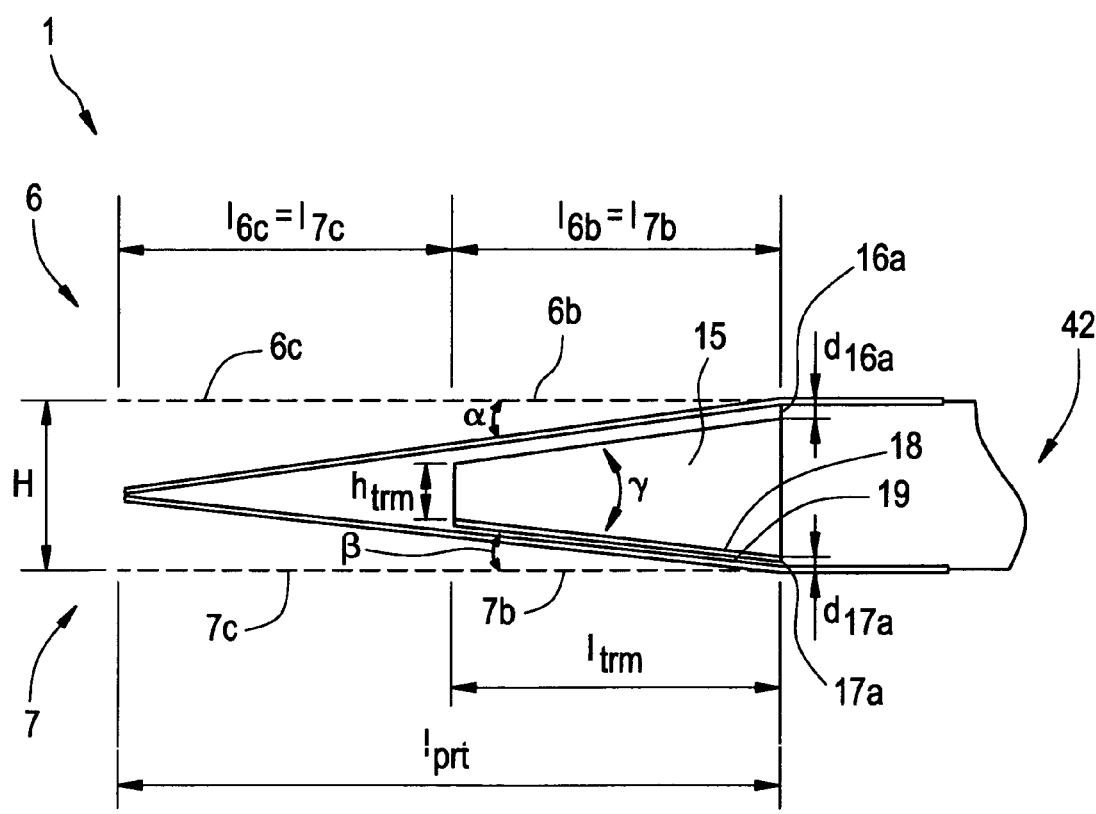
FIG. 9 illustrates a shape of the terminal portion 15 of the first exemplary embodiment shown in FIG. 5A.

FIG. 9 is a cross-sectional view illustrating exemplary structural dimensions of the terminal end portion 15 of the gripping apparatus 1 according to the first exemplary embodiment shown in FIG. 5A. Similar dimensions can be utilized for the terminal tips 35, 39, and 41 of the second, third, and fourth exemplary embodiments. However, it is to be understood that the present invention is not limited to the exemplary dimensions disclosed herein, and any number of factors may dictate selection of different structural dimensions of the gripping apparatus.

The terminal portion 15 has a pyramidal shape and protrudes from the parallelepiped base portion 14 of the probe 8. A length $l_{trm}$ of the terminal portion 15 is equal to approximately half the length $l_{prt}$ of the combined protruding portion 6b and tip end portion 6c, or the combined protruding portion 7b and tip end portion 7c as shown as follows in Equation (1):

$$l_{trm} = \frac{l_{prt}}{2} = \frac{l_{6b}+l_{6c}}{2} = \frac{l_{7b}+l_{7c}}{2} \quad (1)$$

where $l_{prt}=l_{6b}+l_{6c}=l_{7b}+l_{7c}$ is the length of the protruding portion of the nanotubes 6 and 7.

Taking into consideration that a thickness of the electrode film 18 and the insulating films 19 manufactured by the conventional methods are typically in the range of 20 to 50 nm, a height $d_{16a}$ and $d_{17a}$ of stepped portions 16a and 17a providing the free spaces 16 and 17 between the carbon nanotubes 6 and 7 and the terminal end portion 15 may be in the range 40 to 100 nm. Generally, carbon nanotubes have diameters equal to approximately 10 to 50 nm.

The plane angles $\alpha$ and $\beta$ which are assumed to be approximately equal to each other but may be different, are calculated as follows in Equation (2):

$$\alpha = \beta = arctg\frac{H}{2l_{prt}} \quad (2)$$

where $l_{prt}=l_{6b}+l_{6c}=l_{7b}+l_{7c}$, and H is an initial gap, between tip end portions 6c and 7c of the corresponding carbon nanotubes 6 and 7 in case where no voltage is applied. Hence, the plane angle $\gamma$ defined the terminal pyramid portion 15 is equal to $\alpha+\beta$ (i.e., equal to $2\alpha$ or $2\beta$ if $\alpha=\beta$).

A width $h_{trm}$ of the terminal end portion 15 can be determined according to Equation (3) as follows:

$$h_{trm}=H-d_{16a}-d_{17a}-l_{trm}tg\alpha-l_{trm}tg\beta \quad (3)$$

where $tg\alpha$ and $tg\beta$ designate the tangents of the angles $\alpha$ and $\beta$, respectively.

If the angles $\alpha$ and $\beta$ are equal to each other and the heights $d_{16a}$ and $d_{17a}$ of stepped portions 16a and 17a are equal to each other, then Equation (3) can be simplified as follows in Equation 4:

$$h_{trm}=H-2d_{16a}-2l_{trm}tg\alpha=H-2d_{17a}-2l_{trm}tg\beta. \quad (4)$$

Substituting Equation (1) and Equation (2) into Equation (4) yields the width $h_{trm}$ of the terminal end portion 15 as follows in Equation (5):

$$h_{trm} = \frac{H}{2} - 2d_{16a} = \frac{H}{2} - 2d_{17a}. \quad (5)$$

Figure 10:
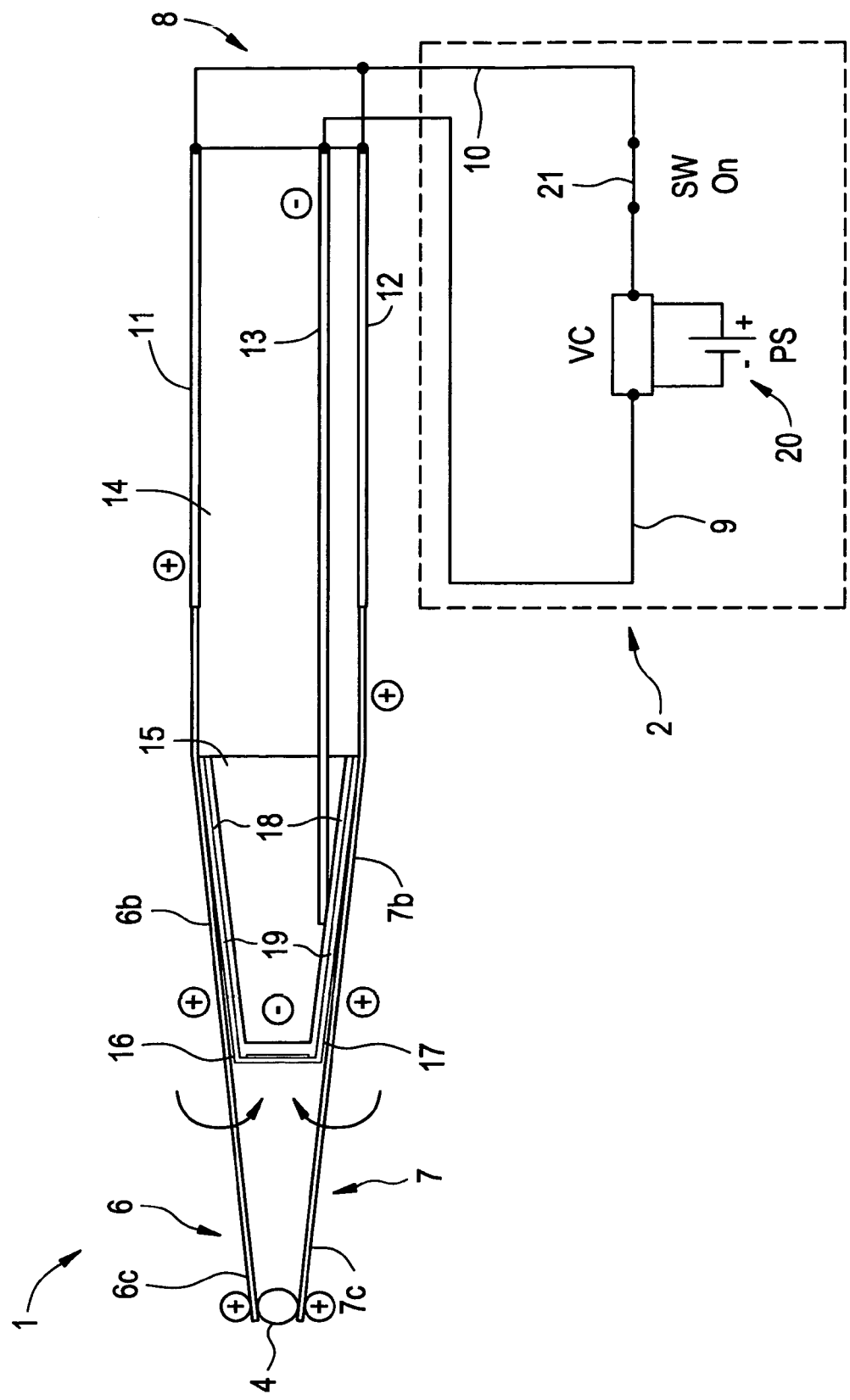
FIG. 10 is an explanatory diagram of an operational principle according to an exemplary embodiment of the present invention.

FIG. 10 is an explanatory diagram of the operation principles of the gripping apparatus of the present invention. FIG. 10 shows the gripping apparatus 1 of the first exemplary embodiment of FIG. 5A in a state of gripping of a spherical nano-particle. However, the operational principles described are equally applicable to each of the exemplary embodiments and to gripping nano-particles having various shapes.

Firstly, a position of the nano-substance 4 lying on the surface of the sample 5 disposed on the microscope stage 180 is detected by STM scanning and using the tip end portions 6c and 7c of the corresponding carbon nanotubes 6 and 7 as probe needles as shown in FIG. 1. Next, the microscope probe 8 is moved downward to contact the sample surface so that the spherical nano-substance 4 is interposed between the tip end portions 6c and 7c. When the switch 21 is turned on in this state, a voltage is applied to the conductive nanotubes 6 and 7 via the electrode films 11 and 12. Simultaneously, the same voltage of opposite polarity is applied to the electrode film 18 covering the terminal end portion 15 of the probe 8 via the electrode film 13. As a result, the protruding portions 6b and 7b of the carbon nanotubes 6 and 7 become positive poles, while the terminal end portion 15 coated by the electrode film 18 becomes a negative pole. Since the positive charge accumulates in the positive poles and the negative charge accumulates in the negative pole, the protruding portions 6b and 7b of the carbon nanotubes 6 and 7 are caused to flex inward by the electrostatic attractive force generated in the free spaces 16 and 17 between the positively charged protruding portions 6b and 7b and the negatively charged electrode film 18. Thus, the tip end portions 6c and 7c move toward each other until they grip the nano-substance 4.

When the switch 21 is turned off, the electrostatic attractive force disappears between the protruding portions 6b and 7b and the electrode film 18. As a result, the tip end portions 6c and 7c are caused to open by the elastic recovery force of the nanotubes thereby releasing the nano-substance 4.

Since the electrode film 18 is covered by the insulting film 19, a short circuit can be prevented between the negatively charged electrode film 18 and the positively charged protruding portions 6b and 7b of the nanotubes 6 and 7 which are deformed and may contact the electrode film 18 at the final stage of deformation.

Figure 11A:
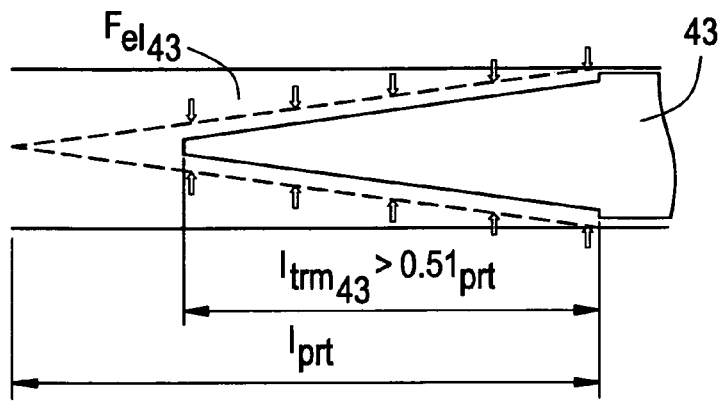
FIGS. 11A, 11B and 11C illustrate other exemplary shapes of a protruding terminal tip.
Figure 11B:
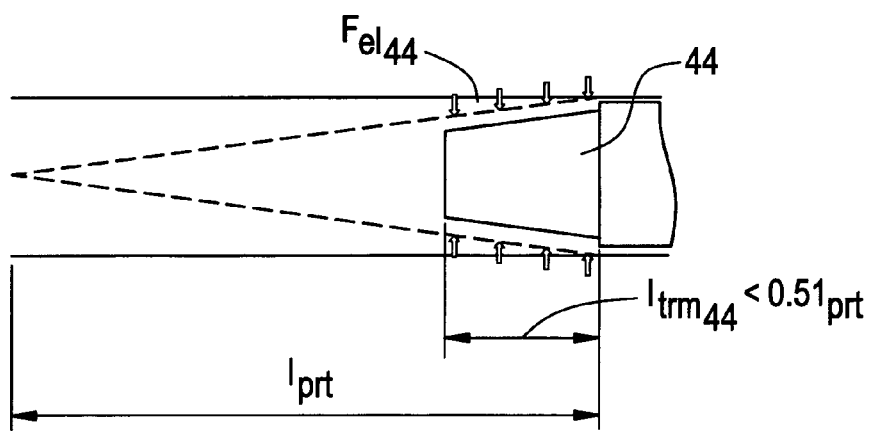
Figure 11C:
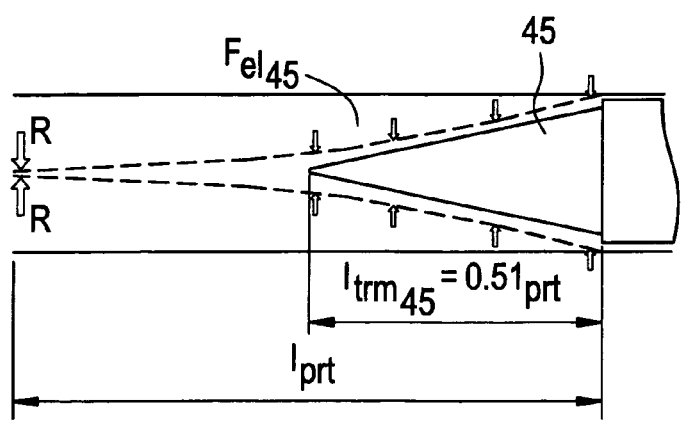

FIGS. 11A, 11B and 11C are exemplary diagrams illustrating other variants of the shape of the protruding probe tip. As shown in FIG. 11A, a probe tip 43 has a length $l_{trm43}$ which is greater than half the length $l_{prt}$ of the protruding portions of the carbon nanotubes. As shown in FIG. 11B, a probe tip 44 has a length $l_{trm44}$ which is less than half the length $l_{prt}$ of the length of the protruding portions of the carbon nanotubes. As shown in FIG. 11C, a probe tip 45 has a length $l_{trm45}$ which is equal to half the length $l_{prt}$ of the length of the protruding portions of the carbon nanotubes. Further, a width $h_{trm45}$ of the terminal end portion of probe tip 45 is less than the width $h_{trm}$ defined by the Equation (5), and in an extreme case the width $h_{trm45}$ can be made to be equal to zero. Since the attractive electrostatic force $F_{el}$ generated between the negatively charged tip and the positively charged nanotubes is proportional to the tip length, such that $F_{el43} > F_{el45} > F_{el44}$ if the width $h_{trm45}$ is defined by the Equation (5). Decreasing the width $h_{trm45}$ less then that defined by the Equation (5) results in increasing the electrostatic force $F_{el45}$ which leads to increasing the gripping force R as will be is described later.

Accordingly, an appropriate tip length may be selected to provide a sufficient force for securely gripping nano-scale objects which are heavy or strongly interact with the substrate layer. On the other hand, a moderate force may be more suitable for gripping soft biological nano-substances like cells, DNA, and so on.

As shown in FIG. 11C, the protruding tip 45 extends to sharpened tip to ensure a highest value of the attractive electrostatic force $F_{el}$, which can be originated between the negatively charged tip and the positively charged nanotubes due to the additional free space between the nanotubes and the tip side surfaces. Thus, the nanotubes experience additional bending strain and transmit the accumulated elastic energy to the ultimate gripping force R acting to the nano-object to be manipulated.

Accordingly, the gripping apparatus of the present invention provides for firm and robust capturing of nano-scale objects with arbitrary shapes, holding nano-scale objects during manipulations, and releasing nano-scale objects at the demanded position on the sample surface. Further, since there is no electric field generated between the tip portions of the carbon nanotubes, the risk of short-circuiting between the carbon nanotubes is eliminated.

Accordingly, the electrostatically driven gripping apparatus of the present invention is not limited to applications involving semiconductor and insulating objects, but also can be used for secure manipulation of electrically sensitive objects such as biological living substances such as cells, genes and DNA that must be handled in a liquid environment.

Further, experiments have shown that the attractive electrostatic force generated between nanotubes of the gripping apparatus of the present invention is larger than that of the conventional nanotweezers in the case where the same voltage is applied. Therefore, a holding force is higher and manipulation is more secure, although an applied voltage may be smaller than in the conventional nanotweezers.

Although exemplary embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. An apparatus for gripping nano-scale objects, the apparatus comprising:
    a probe including a base portion and a terminal portion;
    first and second nanotubes secured to the base portion of the probe, each of the first and second nanotubes including a protruding portion which extends past the base portion and the terminal portion of the probe;
    first and second electrodes formed on the base portion of the probe, the first and second electrodes being electrically connected to the first and second nanotubes, respectively;
    a third electrode disposed on the terminal portion of the probe; and
    a control circuit which is electrically connected to the first, second and third electrodes and applies a voltage to the first, second and third electrodes so that the first and second nanotubes are charged to a first polarity and the third electrode is charged to a second polarity opposite to the first polarity thereby causing the protruding portions of the first and second nanotubes to close due to an electrostatic force generated between the first and second nanotubes and the third electrode.

2. The apparatus of claim 1, further comprising an insulating film formed on an outer surface the third electrode.

3. The apparatus of claim 1, wherein the terminal portion has one of a pyramidal shape, a conical shape and a tapered polygonal shape.

4. The apparatus of claim 3, wherein the terminal portion has one of a planar tip and a pointed tip.

5. The apparatus of claim 1, wherein each of the first and second nanotubes includes a base end portion secured to the base portion of the probe, a protruding portion which extends past the base portion of the probe and along a length of the terminal portion of the probe, and a tip end portion which extends past the terminal portion of the probe.

6. The apparatus of claim 5, wherein the protruding portion extends past the base portion along the length of the terminal portion without contacting the terminal portion.

7. An apparatus for gripping nano-scale objects, the apparatus comprising:
    a probe including a base portion and a terminal portion having a pyramidal shape;
    a plurality of nanotubes secured to at least first and second side surfaces of the base portion of the probe, each of the nanotubes including a protruding portion which extends past the base portion and terminal portion of the probe;
    a plurality of first electrodes formed on the base portion of the probe and electrically connected to the nanotubes;
    a second electrode disposed on the terminal portion of the probe; and
    a control circuit which is electrically connected to the first electrodes and the second electrode, and applies a voltage to the first electrodes and the second electrode so that the nanotubes are charged to a first polarity and the second electrode is charged to a second polarity opposite to the first polarity thereby causing the protruding portions of the nanotubes to close due to an electrostatic force generated between the nanotubes and the second electrode.

8. The apparatus of claim 7, wherein a first set of the nanotubes is secured to the first side surface of the base portion and a second set of the nanotubes is secured to the second side surface of the base portion.

9. The apparatus of claim 7, further comprising an insulating film formed on an outer surface the second electrode.

10. The apparatus of claim 7, wherein the terminal portion has one of a pyramidal shape and a tapered polygonal shape.

11. The apparatus of claim 10, wherein the terminal portion has one of a planar tip and a pointed tip.

12. The apparatus of claim 7, wherein each of the nanotubes includes a base end portion secured to the base portion of the probe, a protruding portion which extends past the base portion of the probe and along a length of the terminal portion of the probe, and a tip end portion which extends past the terminal portion of the probe.

13. The apparatus of claim 12, wherein the protruding portion extends past the base portion along the length of the terminal portion of the probe without contacting the terminal portion of the probe.

14. A nanomanipulator system comprising:
a microscope unit comprising a probe including a base portion and a terminal portion;
a control circuit; and
an apparatus for gripping nano-scale objects disposed on the probe, the apparatus comprising:
  first and second nanotubes secured to the base portion of the probe, each of the first and second nanotubes including a protruding portion which extends past the base portion and the terminal portion of the probe;
  first and second electrodes formed on the base portion of the probe, the first and second electrodes being electrically connected to the first and second nanotubes, respectively;
  a third electrode disposed on the terminal portion of the probe,
  wherein the control circuit which is electrically connected to the first, second and third electrodes and applies a voltage to the first, second and third electrodes so that the first and second nanotubes are charged to a first polarity and the third electrode is charged to a second polarity opposite to the first polarity thereby causing the protruding portions of the first and second nanotubes to close due to an electrostatic force generated between the first and second nanotubes and the third electrode.

15. The nanomanipulator system of claim 14, wherein the apparatus further comprises an insulating film formed on an outer surface the third electrode.

16. The nanomanipulator system of claim 14, wherein the terminal portion has one of pyramidal shape, a conical shape and a tapered polygonal shape.

17. The nanomanipulator system of claim 16, wherein the terminal portion has one of a planar tip and a pointed tip.

18. The nanomanipulator system of claim 14, wherein each of the first and second nanotubes includes a base end portion secured to the base portion of the probe, a protruding portion which extends past the base portion of the probe and along a length of the terminal portion of the probe, and a tip end portion which extends past the terminal portion of the probe.

19. The nanomanipulator system of claim 18, wherein the protruding portion extends past the base portion along the length of the terminal portion of the probe without contacting the terminal portion of the probe.

* * * * *